United States Patent [19]
Condon et al.

[11] Patent Number: 5,744,988
[45] Date of Patent: Apr. 28, 1998

[54] AMPLIFIER CIRCUITS FOR DRIVING LARGE CAPACITIVE LOADS

[76] Inventors: Joseph Henry Condon, 190 Kent Place Blvd., Summit, N.J. 07901; Joseph Peter Savicki, 6 Haver Farm Rd., Clinton, N.J. 08809

[21] Appl. No.: 708,434

[22] Filed: Sep. 5, 1996

Related U.S. Application Data

[60] Provisional application No. 60/005,506, Sep. 29, 1995.
[51] Int. Cl.⁶ .................................................. H03K 1/00
[52] U.S. Cl. ..................... 327/111; 310/316; 310/317; 318/116; 327/436
[58] Field of Search .................... 310/316, 317; 318/116; 327/108, 111, 427, 434, 436

[56] References Cited

U.S. PATENT DOCUMENTS

| | | | |
|---|---|---|---|
| 4,404,502 | 9/1983 | Magori et al. | 318/116 |
| 4,767,959 | 8/1988 | Sakakibara et al. | 310/317 |
| 4,947,074 | 8/1990 | Suzuki | 310/316 |
| 5,264,752 | 11/1993 | Savicki | 310/316 |

*Primary Examiner*—Toan Tran
*Assistant Examiner*—Jeffrey Zweizig

[57] ABSTRACT

In an amplifier for driving a large capacitive load, a boost circuit is included to improve the efficiency of the amplifier where an input to the amplifier has a small signal swing. The amplifier comprises a stack of series-connected charge-storage capacitors serving as secondary power sources. During a charging of the capacitive load, charge is obtained from voltage nodes between the stack capacitors. One or more low-voltage power supplies are connected to the capacitive load in the boost circuit. With these power supplies, during a discharge of the capacitive load, the latter appears to be charged to a higher voltage than it actually is so as to return some charge to the highest voltage node from where a portion of its charge was obtained. As a result, the power consumption in the amplifier is substantially reduced.

20 Claims, 4 Drawing Sheets

AMPLIFIER CIRCUITS FOR DRIVING LARGE CAPACITIVE LOADS

FIELD OF THE INVENTION

The invention relates to amplifier circuits, and in particular to amplifier circuits for driving large capacitive loads with high power efficiencies.

BACKGROUND OF THE INVENTION

Electromechanical devices such as actuators often employ electrostrictive or piezoelectric material, which changes dimensions or generates force in response to electric fields applied thereto. In such electromechanical devices, the electrostrictive or piezoelectric structures present a substantial capacitive load to control electronics. The power efficiency in operating the devices involving charging and discharging the large capacitive load is normally low.

The amplifier circuits disclosed in U.S. Pat. No. 5,264,752 ("the '752 patent") issued Nov. 23, 1993 to Savicki help improve the aforementioned power efficiency. The '752 patent is hereby incorporated by reference. FIG. 1 illustrates representative amplifier circuit 100 in accordance with the disclosed technique. As shown in FIG. 1, P and N channel field effect transistors (FETs) are controlled by an input signal, $V_{in}$, to charge and discharge a capacitive load, $C_L$, connected to circuit 100 through lead 101. The N channel FETs are denoted N1, N2 and N3, while the P channel FETs are denoted P1, P2 and P3. The source terminals of these FETs are indicated by a lower case "s."

Central to the prior art circuit is a stack of K series-connected charge-storage capacitors (e.g., $C_1$, $C_2$ and $C_3$) which is connected to a high-voltage power supply 101 at one end, and ground through lead 103 at the other end, where K=3 in this instance. The voltage of power supply 101 is extremely high, and is denoted $V_0$. Typically, $C_1=C_2=C_3>>C_L$. In addition, Zener diodes, Dz1, Dz2 and Dz3, are connected in parallel to $C_1$, $C_2$ and $C_3$, respectively. Each Zener diode has a Zener voltage Vz greater than $1/K\ V_0$ (i.e., ⅓ $V_0$) by a few volts. Diodes, D1 through D14, are also employed to ensure that the charge flows in proper directions in the amplifier circuit. Throughout this disclosure, forward voltage drops across diodes, such as D1 though D14, are conveniently ignored as their values are relatively small.

In accordance with the disclosed technique, nodes nd1 and nd2 between adjacent capacitors in the stack act as secondary power sources of increasing voltages, each being a fraction of $V_0$, where node nd1 is associated with $C_1$ and node nd2 is associated with $C_2$. These secondary power sources afford a charging of $C_L$ more efficiently than if only $V_0$ were present. During the discharge of $C_L$, charge is returned to the stack capacitors for reuse in a subsequent charging operation.

Amplifier circuit 100 essentially behaves as a voltage follower (i.e., the voltage across $C_L$ takes after $V_{in}$). Maximum power efficiency of the prior art circuit is achieved when an input has a full voltage swing or range. Otherwise, a small input signal swing results in a much lower efficiency, as demonstrated in the following illustration:

In this illustration, $V_{in}$ starts at 0 volt. As the voltage across $C_L$ follows that of $V_{in}$, it becomes 0 volt after a delay. The voltage drop across each of stack capacitors $C_1$, $C_2$ and $C_3$ approximately equals $V_0/3$. Thus, with respect to ground, the electric potentials at nd1 and nd2 are approximately $V_0/3$ and $2V_0/3$, respectively.

Continuing the illustration, $V_{in}$ now assumes a small signal swing above zero volt. The magnitude of this signal swing is $V_A$, where $V_A<<V_0/3$. In response, circuit 100 performs a charging step where $C_L$ is charged to raise the voltage thereacross. In accordance with the disclosed technique, nodes nd1 and nd2 serve as secondary power sources of voltages $V_0/3$ and $2V_0/3$, respectively. In general, a higher node (e.g., nd2 with respect to nd1) in the capacitor stack corresponds to a higher electric potential (e.g., $2V_0/3$ with respect to $V_0/3$). Depending on the amplitude of the input, there may be more than one node providing charge to $C_L$ during the charging step. The actual number of nodes providing the charge varies with the amplitude of the input. In this instance, as $V_{in}$ rises from 0 volt to $V_A<<V_0/3$, N1 is turned on, and N2 and N3 remain off. Charge is drawn from $C_1$ to $C_L$, thereby charging $C_L$ until the voltage thereacross becomes $V_A$. As a result, the voltage drop across $C_1$ is reduced and the voltage drops across $C_2$ and $C_3$ are accordingly increased. Since the amplitude of $V_{in}$ is much lower than $V_0/3$ in this instance, the highest electric potential and only node associated with a stack capacitor (i.e., $C_1$) providing the charge to $C_L$ is nd1.

It should be pointed out that in this illustration the input signal swing has a zero DC offset because $V_{in}$ starts at zero volt. Had $V_{in}$ started at $V_0/3$ volt for example, the input signal swing would have had a $V_0/3$ volt offset, and the highest electric potential node associated with the stack capacitor (i.e. $C_2$) providing charge to $C_L$ would then have been nd2.

In a discharging step where $V_{in}$ drops from $V_A$ to zero volt, N1 is turned off while P1, P2 and P3 are turned on. As a result, charge flows from $C_L$ through P3, P2 and P1 to ground. The voltage drops across stack capacitors $C_1$, $C_2$ and $C_3$ are however unaffected by this step. As all the charge is drained from $C_L$ to ground, the voltage drop across $C_L$ becomes zero volt.

If the cycle consisting of the charging and discharging steps is repeated, the voltage drop across $C_1$ further decreases each time in the charging step. At the same time, the voltage drops across $C_2$ and $C_3$ further increase. This phenomenon continues until the voltage drop across $C_2$ and/or $C_3$ equals Vz. At that point, Dz2 and/or Dz3 disallows a further increase in the voltage drop across $C_2$ and/or $C_3$. As a result, diode D14 becomes forward-biased and conducting. Each subsequent charging step calls for a charge flow from high-voltage power supply 101 through D14, Dz3, Dz2, D13 and N1 to $C_L$. In other words, each subsequent cycle calls for delivering from power supply 101 an amount of charge $Q=C_LV_A$, or demanding from the power supply an amount of energy $E_{100}=QV_0$. In a circuit operation having a frequency of the small signal swing cycle at f Hz, the power $P_{100}$ consumed from power supply 101 is thus:

$$P_{100}=E_{100}f=QV_0f=C_LV_AV_0f. \quad (1)$$

Since $V_0$ is extremely high in power supply 101, the power consumption $P_{100}$ in prior art amplifier circuit 100 is undesirably high.

SUMMARY OF THE INVENTION

The invention overcomes the prior art limitations by employing a boost circuit including one or more power sources whose voltage is lower than that of a high-voltage power source in an amplifier circuit for driving a capacitive load. In accordance with the invention, during a small input signal swing cycle, selected stack capacitors in the amplifier circuit are used to charge the capacitive load. With the low-voltage power sources, the load appears to be charged to a voltage higher than that across the load. As a result, during a discharge of the load, some charge can be returned from the load to one of the selected stack capacitors, which is associated with the highest electric potential node involved in the charging of the load.

Advantageously, during the small signal swing cycles, the power is not drawn from the high-voltage power source as in the prior art amplifier circuit. Rather, the power is drawn from the low-voltage power sources to charge and discharge the capacitive load. The power thus drawn is relatively low, with respect to that in the prior art circuit.

BRIEF DESCRIPTION OF THE DRAWING

Throughout this disclosure, unless otherwise stated, like elements and circuit components are denoted by the same numerals.

DETAILED DESCRIPTION

Figure 2:
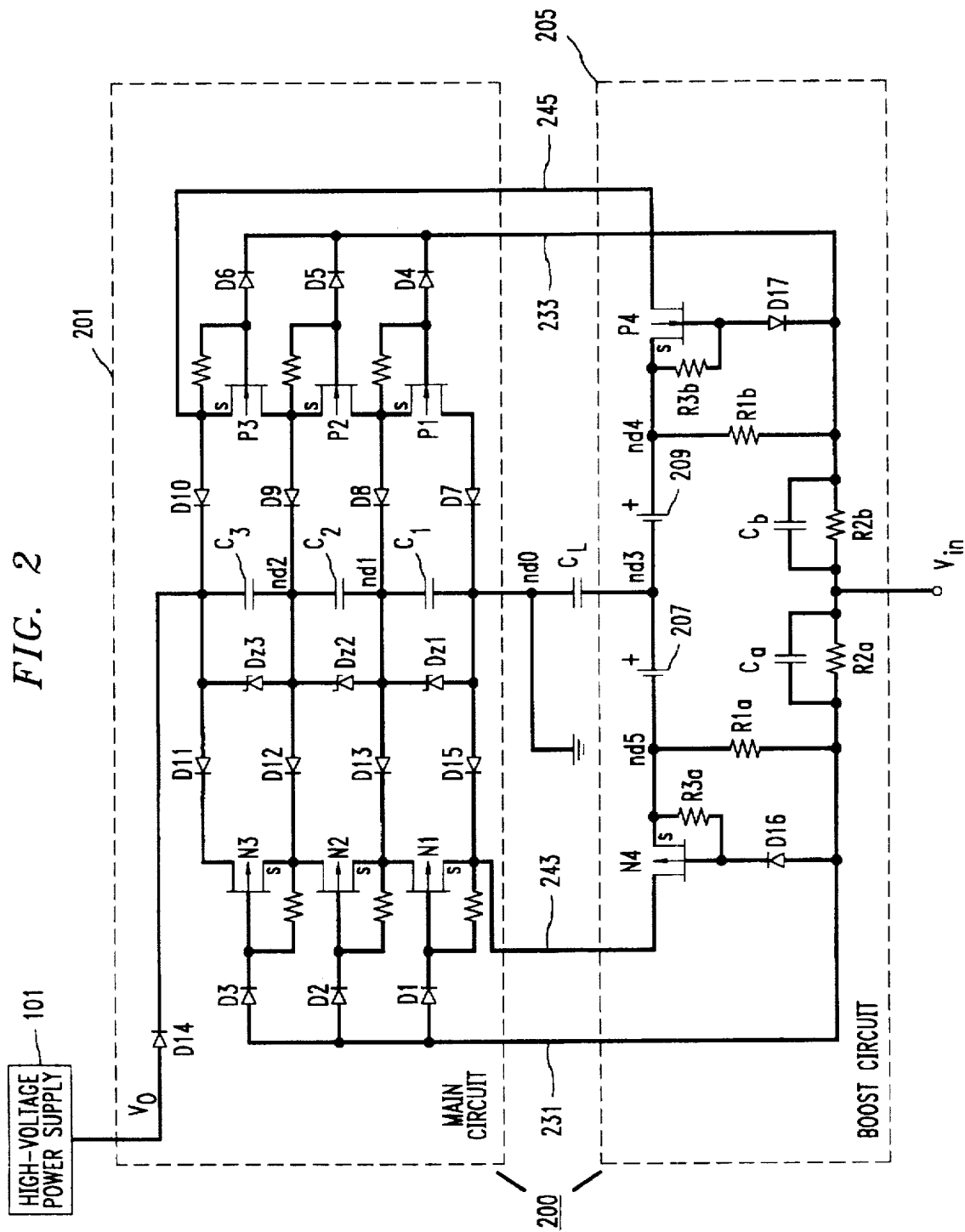
FIG. 2 illustrates an amplifier circuit including a boost circuit in accordance with the invention.

FIG. 2 illustrates amplifier circuit 200 embodying the principles of the invention. For example, circuit 200 may be employed in electromechanical devices including actuators where electrostrictive or piezoelectric structures afford substantial capacitive loads. Circuit 200 is an improvement over prior art amplifier circuit 100 for driving such capacitive load. Among other things, circuit 100 does not provide desirable power efficiency when the input to the circuit has a small signal swing or range.

Circuit 200 overcomes the prior art limitations by including boost circuit 205 for reducing the power requirement of the circuit especially when the input signal swing is small. In accordance with the invention, one or more power supplies, whose voltages are much lower than the voltage of high-voltage power supply 101, are included in the boost circuit. With these low-voltage power supplies, during a discharge of the capacitive load in small input signal swing cycle, the load manages to return some charge to the stack capacitor associated with the highest electric potential node from where at least a portion of its charge was obtained. As a result, the power is drawn from the low-voltage power supplies, as opposed to high-voltage power supply 101 as in the prior art, and the power thus drawn is relatively low.

As shown in FIG. 2, circuit 200 comprises main circuit 201 and boost circuit 205. Main circuit 201 is similar to circuit 100, with minor modifications. For example, like circuit 100, main circuit 201 comprises a stack of K series-connected charge-storage capacitors, where K=3 in this particular embodiment. Unlike circuit 100, diode D15 has been added in main circuit 201 to form a path for charging $C_L$ with a low-voltage power source in a manner to be described.

Capacitive load $C_L$ in circuit 200 is connected to boost circuit 205 at one end, and to main circuit 201 at node nd0 and ground at the other end. In accordance with the invention, boost circuit 205 comprises low-voltage power supplies 207 and 209 whose combined voltage equals $V_O/K$. In this instance, $V_O$=90 volts and since K=3, $V_O/K$=30 volts. By way of example, but not limitation, this combined voltage is divided equally between power supplies 207 and 209. Thus, the voltage of each power supply is $V_O/2K$ in this instance. As shown in FIG. 2, $C_L$ is connected to boost circuit 205 at node nd3 between power supplies 207 and 209. In practice, power supplies 207 and 209 constitute a center tapped power supply where $C_L$ is connected to its center tap.

In addition, $V_{in}$ is connected to the negative terminal of power supply 207 through resistors R1a and R2a, and is also connected to the positive terminal of power supply 209 through resistors R1b and R2b. The gate terminal of N channel FET N4 is connected to the cathode of diode D16 and to its source terminal through resistor R3a. The drain terminal of N4 is connected to main circuit 201 through charging path 243. R1a is connected to the source terminal of N4 at one end and the anode of D16 at the other end. Similarly, the gate terminal of P channel FET P4 is connected to the anode of diode D17 and to its source terminal through resistor R3b. The drain terminal of P4 is connected to main circuit 201 through discharging path 245. R1b is connected to the source terminal of P4 at one end and to the cathode of D17 at the other end.

In this particular embodiment, the resistance values of R2a and R2b are identical and equal to a predetermined value. The resistance values of R1a and R1b are identical, and selected such that the voltage drops across the resistors equal the threshold voltages needed to turn on both D16 and N4, and both D17 and P4, respectively. Capacitor $C_a$ is connected in parallel to R2a to provide a low impedance between N FET gate drive line 231 and $V_{in}$ for a high frequency input. Similarly, capacitor $C_b$ is connected in parallel to R2b to provide a low impedance between P FET gate drive line 233 and $V_{in}$ for a high frequency input.

Like circuit 100, circuit 200 behaves as a voltage follower (i.e., the voltage across $C_L$ takes after $V_{in}$). The improvement in the efficiency of circuit 200 over that of circuit 100 will be appreciated by considering the following illustrations where $C_L$ is charged and discharged in response to $V_{in}$ having a small signal swing.

In the first illustration, without loss of generality, $V_{in}$ of circuit 200 starts at 0 volt. As the voltage across $C_L$ follows that of $V_{in}$, it becomes 0 volt after a delay, as in the previous illustration. The voltage drop across each of stack capacitors $C_1$, $C_2$ and $C_3$ in circuit 200 approximately equals $V_O/3$. Thus, with respect to ground, the electric potentials at nd1 and nd2 are approximately $V_O/3$ and $2V_O/3$, respectively.

Continuing the illustration, $V_{in}$ now assumes a small signal swing above zero volt. The magnitude of this signal swing is denoted $V_A$, where $V_A \ll V_O/6$. Like circuit 100, circuit 200 performs a charging step where $C_L$ is charged to raise the voltage thereacross. As $V_{in}$ rises from 0 volt to $V_A \ll V_O/6$, N4 is turned on, and N1, N2 and N3 remain off. Charge is drawn from low-voltage source 207 associated with nd3 to $C_L$ through D15, charging path 243 and N4, thereby charging $C_L$ until the voltage thereacross becomes $V_A$. Since the amplitude of $V_{in}$ is much lower than $V_O/6$ in this instance, the highest electric potential and only node providing the charge to $C_L$ is nd3.

When $V_{in}$ drops from $V_A$ to zero volt, the effect occasioned by discharging $C_L$ in circuit 200 differs from that in circuit 100. In the discharging step, N4 is now turned off while P4, P3, P2 and P1 are turned on. Because of the inclusion of the low-voltage power supply 209 in boost circuit 205, node nd4 at the intersection of R1b and power supply 209 is at an electric potential of $V_O/6$ (the voltage of power supply 209) plus the voltage across $C_L$. This combined voltage is only higher than the electric potential at nd0, which is grounded. As a result, charge flows from $C_L$ through low-voltage power supply 209, P4, discharging path 245, P3, P2, P1 and D7 to ground. After all the charge is depleted from $C_L$, the voltage drop across $C_L$ again becomes zero volt.

Thus, in this illustration, unlike circuit 100, the power incurred in charging and discharging $C_L$ in circuit 200 is provided by low-voltage power supplies 207 and 209 whose combined voltage is $V_O/K$. Since the amount of charge per cycle delivered through power supplies 207 and 209 is $Q=C_L V_A$, they consume energy $E_{200}=QV_O/K$ per cycle, where K=3 in this instance. In a circuit operation having a frequency of the small signal swing cycle at f Hz, the power, $P_{200}$, consumed from power supplies 207 and 209 in circuit 200 is:

$$P_{200}=E_{200}f=Q(V_O/K)f=C_L V_A(V_O/K)f. \quad (2)$$

By comparing expression (2) here with expression (1) in the case of circuit 100, one readily appreciates that the power consumption in amplifier circuit 200 is reduced by a factor of K, with respect to circuit 100.

A second, more interesting illustration where $V_{in}$ of circuit 200 starts with a DC offset, and the charging and discharging of $C_L$ involve at least one of stack capacitors $C_1$, $C_2$ and $C_3$, will now be described. Without loss of generality, $V_{in}$ starts at $V_O/6$ volts. As the voltage across $C_L$ follows that of $V_{in}$, it becomes $V_O/6$ after a delay. The voltage drop across each of stack capacitors $C_1$, $C_2$ and $C_3$ in circuit 200 approximately equals $V_O/3$. Thus, with respect to ground, the electric potentials at nd1 and nd2 are approximately $V_O/3$ and $2V_O/3$, respectively.

Continuing the illustration, $V_{in}$ now assumes a small signal swing above $V_O/6$. The magnitude of this signal swing is $V_A$, where $V_A << V_O/6$. Like circuit 100, circuit 200 performs a charging step where $C_L$ is charged to raise the voltage thereacross. As $V_{in}$ rises from $V_O/6$ volts to $V_{peak}=V_O/6+V_A$ (thus $V_O/6 < V_{peak} << V_O/3$), N1 and N4 are turned on, and N2 and N3 remain off. Charge is drawn from $C_1$ associated with nd1 to $C_L$ through D13, N1, charging path 243, N4 and power supply 207, thereby charging $C_L$ until the voltage thereacross becomes $V_{peak}$. As a result, the voltage drop across $C_1$ is reduced and the voltage drops across $C_2$ and $C_3$ are accordingly increased. Since the amplitude of $V_{in}$ is much lower than $V_O/3$ in this instance, the highest electric potential and only node associated with a stack capacitor (i.e., $C_1$) providing the charge to $C_L$ is nd1.

In accordance with the invention, when $V_{in}$ drops from $V_{peak}$ to $V_O/6$ volts, the effect occasioned by discharging $C_L$ in circuit 200 again differs from that in circuit 100. In the discharging step, N1 and N4 are now turned off while P4, P3 and P2 are turned on, and P1 remains off. Because of the inclusion of the low-voltage power supply 209 in boost circuit 205, node nd4 at the intersection of R1b and power supply 209 is at an electric potential of $V_O/6$ (the voltage of power supply 209) plus the voltage across $C_L$ ($V_{peak}$ at the beginning of the discharge). This combined voltage is higher than the electric potential at nd1, which is slightly lower than $V_O/3$. As a result, charge flows from $C_L$ to $C_1$ through low-voltage power supply 209, P4, discharging path 245, P3, P2 and D8. That is, unlike circuit 100, some of the charge in $C_L$ of circuit 200 is returned to nd1 and thus $C_1$ in the discharging step. After the charge is returned by $C_L$, the voltage drop across $C_L$ again becomes $V_O/6$ volts. However, the effect of returning charge to $C_1$ is significant in that the returned charge causes the voltage drop across $C_1$ to increase.

Thus, after a cycle of charging and discharging $C_L$, like circuit 100, the voltage drops across stack capacitors $C_2$ and $C_3$ in circuit 200 are slightly increased. However, unlike circuit 100, the voltage drop across stack capacitor $C_1$ in circuit 200 is increased (back to $V_O/3$) during the discharge of $C_L$, in accordance with the invention. As a result, diode D14 connected to high-voltage power supply 101 is reverse-biased and remains non-conducting, and power supply 101 is precluded from providing charge. This phenomenon continues in subsequent cycles of the charging step followed by the discharging step. That is, power supply 101 in circuit 200 provides no energy or power in the case of small signal swing cycles.

However, some energy is consumed by low-voltage power supplies 207 and 209 in delivering charge between $C_L$ and $C_1$ during each cycle. Since the amount of charge per cycle delivered through power supplies 207 and 209 is $Q=C_L V_A$, they consume energy $E_{200}=QV_O/K$ per cycle, where K=3 in this instance. In a circuit operation having a frequency of the small signal swing cycle at f Hz, the power, $P_{200}$, consumed from power supplies 207 and 209 in circuit 200 is thus:

$$P_{200}=E_{200}f=Q(V_O/K)f=C_L V_A(V_O/K)f. \quad (3)$$

It should be pointed out that expression (3) is identical to expression (2) and, again, in this illustration the power consumption in amplifier circuit 200 is reduced by a factor of K, with respect to circuit 100.

The foregoing merely illustrates the principles of the invention. It will thus be appreciated that those skilled in the art will be able to devise numerous other circuits which embody the principles of the invention and are thus within its spirit and scope.

For example, in the disclosed embodiment, a first terminal of capacitive load $C_L$ is connected to node nd0 and ground, and a second terminal thereof is connected to node nd3. However, for a capacitive load which is susceptible to a break down when having a negative voltage thereacross, it may be more desirable to connect its second terminal to nd4, instead of nd3. With that rearrangement, the capacitive load secures a positive voltage offset from power supply 209 to reduce the risk of having such a break down. Similarly, for a capacitive load which needs to be driven below ground (i.e. less than 0 volt), it may be more desirable to connect its second terminal to nd5, instead of nd3, to secure a negative voltage offset from power supply 207.

In addition, in the disclosed embodiment, low-voltage power supplies 207 and 209 are connected to capacitive load $C_L$ in such a way that the latter appears to be charged to a higher voltage than it actually is during its discharge. As such, charge can be returned from $C_L$ to the stack capacitor associated with the highest electric potential node involved in the charging step. As an alternative, one or more low-voltage power supplies may be connected to $C_L$ during a charging thereof to actually charge $C_L$ to a voltage higher than that of the highest electric potential node involved. Of course, it will be appreciated that a person skilled in the art may use a combination of these two approaches in implementing the invention.

More importantly, the components of circuit 200 may be rearranged to improve its performance. For example, low-voltage power supplies 207 and 209 in boost circuit 205 are not grounded. As a result, boost circuit 205 must follow the high voltage signal of the capacitive load, which is not desirable. Moreover, in practice, current may leak across transformers of power supplies 207 and 209, and flows through the capacitive load, thus undesirably causing noise at the load.

Figure 3:
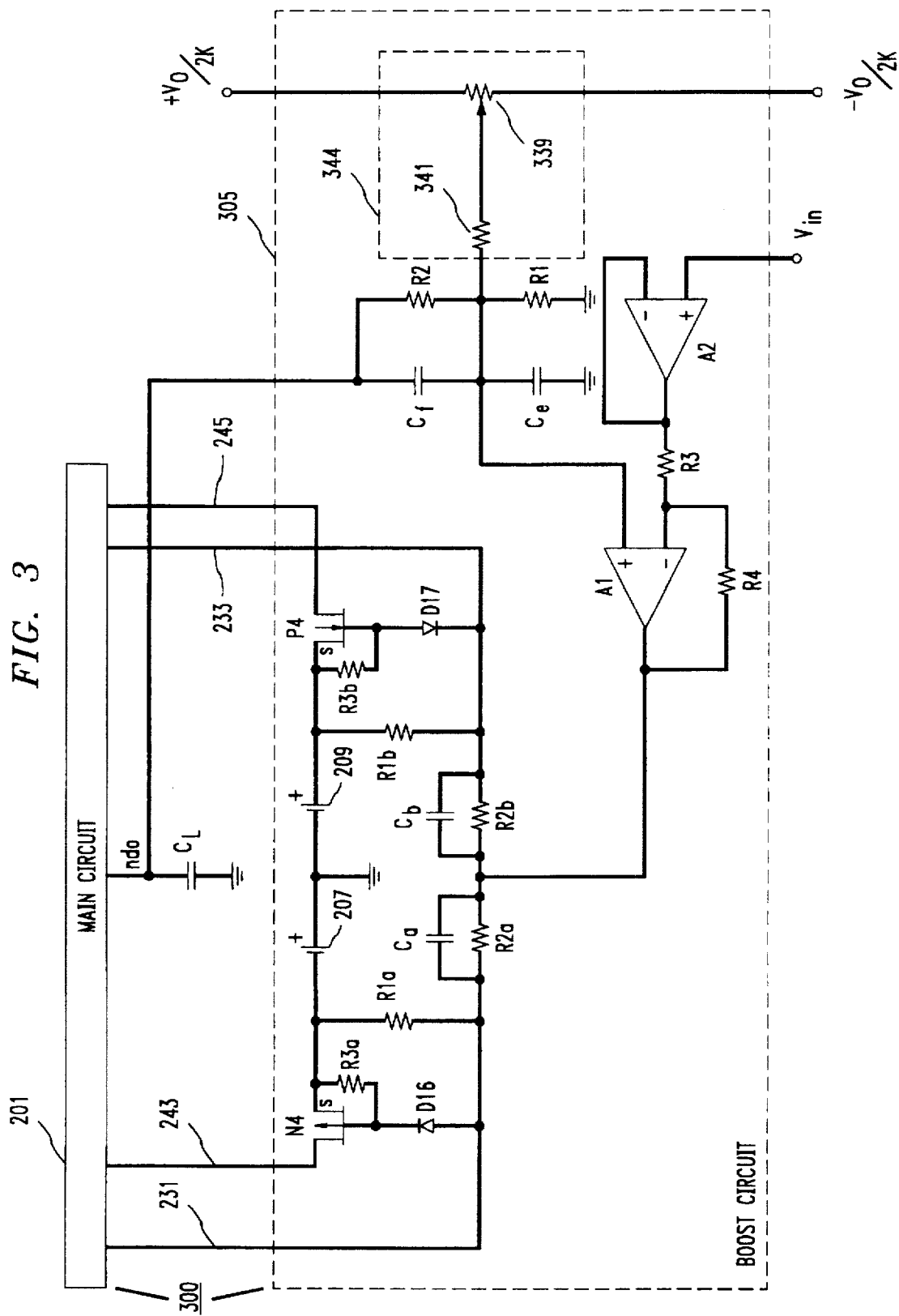
FIG. 3 illustrates an amplifier circuit which is an improvement over the circuit of FIG. 2.

Referring to FIG. 3, amplifier circuit 300 is an improved version of circuit 200. In boost circuit 305, power supply 207 is grounded at its positive terminal while power supply 209 is grounded at its negative terminal. With such grounding, the power supplies no longer float. However, had it been such change alone, amplifier circuit 300 would no longer behave as a voltage follower providing a positive unity gain. Rather, it would provide a large ill-defined negative gain. To solve that problem, a negative feedback and a signal conditioning input stage have been added in boost circuit 305 to control the gain.

To that end, capacitive load $C_L$ is connected to stack capacitors C1, C2 and C3 at node nd0 which, however, is no longer grounded. Instead, the stack capacitors are grounded through $C_L$. Moreover, a resistor-capacitor divider amplifier comprising resistors R1 and R2, and capacitors $C_e$ and $C_f$ provides the negative feedback from the load output at nd0. In this example, R1=1 KΩ, R2=100 KΩ, $C_e$=1 μF and $C_f$=0.01 μF, and the divider amplifier affords a gain of 1/100. Variable bias source 344 comprising resistor 341 and potentiometer 339 is used to adjust a steady state operating point of the divider amplifier. The reference electric potentials, $-V_O/2K$ and $+V_O/2K$, for potentiometer 339 can be conveniently obtained from low-voltage power supplies 207 and 209, respectively. In addition, operational amplifier A1 is connected to R3 and R4 in a conventional manner to afford a gain of R4/R3. In this example, R4=100 R3. Thus A1 affords a gain of 100 to compensate for the gain of 1/100 by the divider amplifier. Operational amplifier A2 is configured as a unity gain buffer to effect a high input impedance at $V_{in}$. With the above arrangement, a gain of 100 from $V_{in}$ to nd0 is achieved, allowing $V_{in}$ of circuit 300 to be 1/100 the amplitude of the required $V_{in}$ of circuit 200.

Thus, by rearranging the grounding of circuit 200 and by manipulating the values of R1, R2, R3 and R4 above, a controllable gain is achieved in circuit 300. In fact, this approach can generally be applied to an amplifier circuit of the type of circuit 100 to achieve a controllable gain, regardless of whether a boost circuit is employed.

Figure 1:
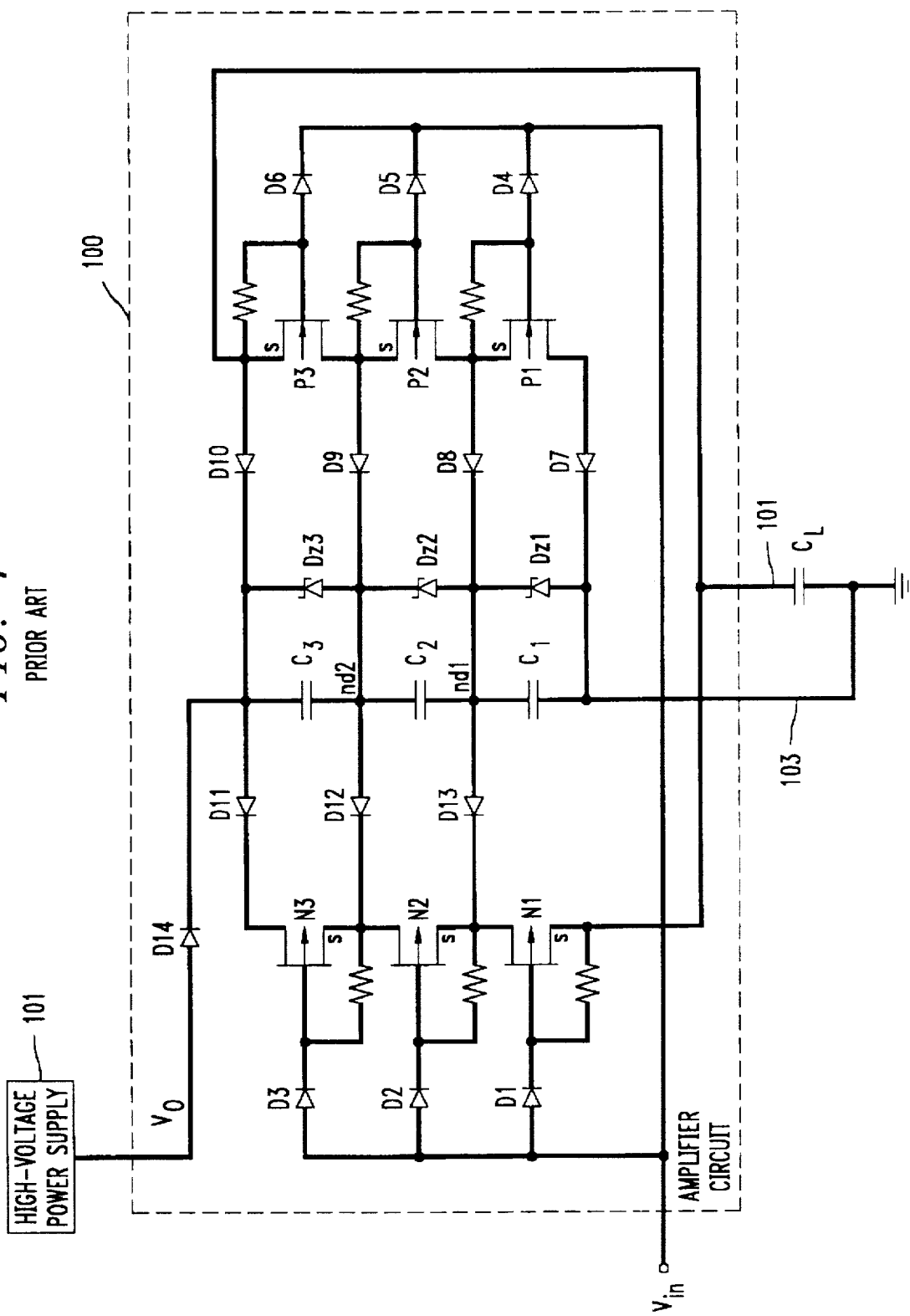
FIG. 1 illustrates a prior art amplifier circuit for driving a large capacitive load.
Figure 4:
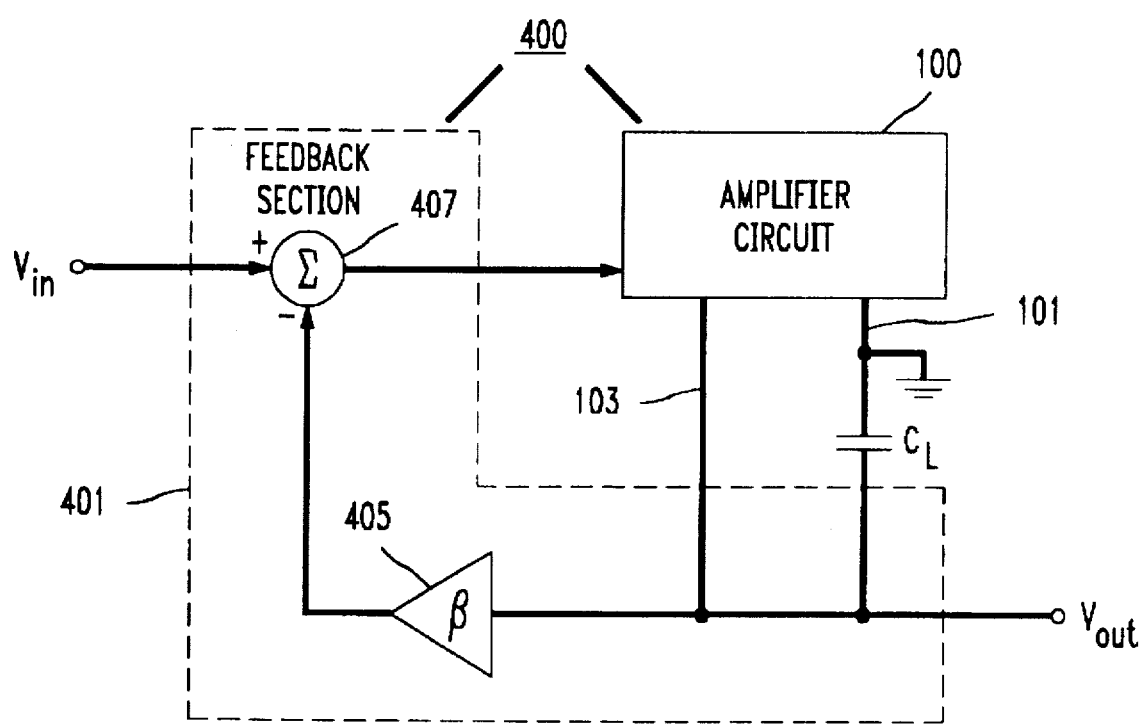
FIG. 4 illustrates an amplifier circuit which is an improvement over the prior art circuit of FIG. 1.

By way of example, FIG. 4 illustrates amplifier circuit 400 which is an improved version of amplifier circuit 100 in FIG. 1. Circuit 400 comprises circuit 100, and feedback section 401 for providing a controllable gain at the output of $C_L$. Like circuit 300, stack capacitors $C_1$, $C_2$ and $C_3$ (not shown in FIG. 4) within circuit 100 is connected to $C_L$ through lead 103, which is no longer connected to ground in circuit 400. However, lead 101 is now connected to ground, and the stack capacitors are thus grounded through $C_L$.

Feedback section 401 provides a negative feedback to circuit 100 to achieve the controllable gain. To that end, the output of $C_L$, denoted $V_{out}$ is fed back to circuit 100 through gain element 405 and subtracter 407. Specifically, gain element 405 provides a first input of $\beta V_{out}$ to subtracter 407, where the gain value $\beta<1$, and a second input to subtracter 407 is drawn from $V_{in}$. Subtracter 407 accordingly provides an output of $V_{in}-\beta V_{out}$ to circuit 100. It can be shown that $V_{out}$ in circuit 400 is stabilized when $V_{in}-\beta V_{out}=0$. Thus, in a steady state, $V_{out}=V_{in}/\beta$, and a controllable gain of $1/\beta$ is achieved in circuit 400.

We claim:

1. A boost circuit for use in an amplifier for driving a capacitive load, said amplifier comprising a plurality of capacitors arranged in series-connected stack relation, said boost circuit comprising:

at least one voltage source connected to said capacitive load; and means for selecting one or more of the stack capacitors to provide charge to said capacitive load during a charging phase, at least a portion of the charge received by said capacitive load being returned to each of the selected stack capacitors during a discharging phase, said voltage source delivering said charge therethrough in at least one of the charging and discharging phases.

2. The circuit of claim 1 wherein said at least one voltage source comprises first and second voltage sources, the first voltage source delivering said charge therethrough during said charging phase, and the second voltage source delivering said charge therethrough during said discharging phase.

3. The circuit of claim 2 wherein said capacitive load is connected to ground at one end and to a junction between said first and second voltage sources at the other end.

4. The circuit of claim 2 wherein said capacitive load is connected to ground at one end and to only one of terminals of said first and second voltage sources at the other end.

5. The circuit of claim 1 further comprising means for providing a negative feedback from said capacitive load to afford a controllable gain to an input to said amplifier.

6. The circuit of claim 5 wherein the providing means includes a first amplifier circuit for providing a first gain to said input.

7. The circuit of claim 6 wherein said first amplifier circuit comprises a capacitor-resistor divider.

8. The circuit of claim 6 wherein said providing means further includes a second amplifier circuit for providing a second gain to an output of said first amplifier circuit.

9. The circuit of claim 8 wherein said second amplifier circuit comprises an operational amplifier.

10. The circuit of claim 1 further comprising a buffer for providing a high impedance to an input to said amplifier.

11. An amplifier circuit for driving a capacitive load comprising:

a plurality of capacitors arranged in series-connected stack relation;

connecting points between adjacent ones of the stack capacitors each comprising a node, each node being associated with a respective one of said stack capacitors;

at least one voltage source connected to said capacitive load;

a plurality of switching means; and means for controlling the switching means to provide charge from selected ones of said stack capacitors to said capacitive load in a charging phase, a particular one of the selected stack capacitors associated with a node having the highest electric potential of all the nodes associated with said selected stack capacitors, and for controlling the switching means to discharge said capacitive load in a discharging phase, a portion of said charge received by said capacitive load being returned to the particular stack capacitor during said discharging phase, said voltage source delivering said charge therethrough during at least one of the charging and discharging phases.

12. The circuit of claim 11 wherein the capacitance value of each of said stack capacitors are substantially identical.

13. The circuit of claim 11 wherein said at least one voltage source comprises first and second voltage sources, said first voltage source delivering said charge therethrough during said charging phase and said second voltage source delivering said charge therethrough during said discharging phase.

14. The circuit of claim 13 wherein the value of an electric potential provided by said first voltage source equals that provided by said second voltage source.

15. The circuit of claim 13 wherein said capacitive load is connected to ground at one end and to a junction between said first and second voltage sources at the other end.

16. The circuit of claim 13 wherein said capacitive load is connected to ground at one end and to only one of terminals of said first and second voltage sources at the other end.

17. The circuit of claim 11 wherein the capacitive load is connected to ground at one end and said stack capacitors at the other end.

18. An amplifier circuit for driving a capacitive load comprising:

- a plurality of capacitors arranged in series-connected stack relation, said capacitive load being connected to the stack capacitors at one end, and to ground at the other end;
- means for controlling the switching means to provide charge from selected ones of said stack capacitors to said capacitive load in a charging phase, and for controlling the switching means to discharge said capacitive load in a discharging phase; and
- means for feeding an output of said capacitive load back to said circuit to provide a controllable gain to an input to said circuit.

19. The circuit of claim 18 wherein the feeding means includes a gain element for scaling an amplitude of said output.

20. The circuit of claim 19 wherein the feeding means further includes means for forming a difference between said input and the scaled version of said output.

* * * * *